(12) United States Patent
Muramoto et al.

(10) Patent No.: US 8,648,377 B2
(45) Date of Patent: *Feb. 11, 2014

(54) SEMICONDUCTOR LIGHT-EMITTING DEVICE

(71) Applicants: Eiji Muramoto, Kawasaki (JP); Shinya Nunoue, Ichikawa (JP)

(72) Inventors: Eiji Muramoto, Kawasaki (JP); Shinya Nunoue, Ichikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/705,342

(22) Filed: Dec. 5, 2012

(65) Prior Publication Data

US 2013/0092898 A1 Apr. 18, 2013

Related U.S. Application Data

(63) Continuation of application No. 13/238,818, filed on Sep. 21, 2011, now Pat. No. 8,384,109, which is a continuation of application No. 12/408,806, filed on Mar. 23, 2009, now Pat. No. 8,093,608.

(30) Foreign Application Priority Data

Jun. 30, 2008 (JP) ................................. 2008-170967

(51) Int. Cl.
*H01L 33/00* (2010.01)
*H01L 21/00* (2006.01)

(52) U.S. Cl.
USPC .................. 257/98; 257/79; 257/99; 438/22; 438/29

(58) Field of Classification Search
USPC ............................. 438/22, 29; 257/79, 98, 99
See application file for complete search history.

(56) References Cited

U.S. PATENT DOCUMENTS 5,877,558 A 3/1999 Nakamura et al.
6,008,539 A * 12/1999 Shibata et al. ................ 257/745

(Continued)

FOREIGN PATENT DOCUMENTS

JP 11-87772 A 3/1999
JP 2000-294837 10/2000

(Continued)

OTHER PUBLICATIONS

Japanese Office Action with English Translation issued Jul. 26, 2011, in Japanese Patent Application No. 2008-170967, filed Jun. 30, 2008, 5 pages.

(Continued)

*Primary Examiner* — Michael Lebentritt
*Assistant Examiner* — Aaron Dehne
(74) *Attorney, Agent, or Firm* — Oblon, Spivak, McClelland, Maier & Neustadt, L.L.P.

(57) ABSTRACT

A semiconductor light-emitting device including a substrate, an n-type semiconductor layer formed on the substrate, an active layer laminated on the n-type semiconductor layer and capable of emitting a light, a p-type semiconductor layer laminated on the active layer, an n-electrode which is disposed on a lower surface of the semiconductor substrate or on the n-type semiconductor layer and spaced away from the active layer and p-type semiconductor layer, and a p-electrode which is disposed on the p-type semiconductor layer and includes a reflective ohmic metal layer formed on the dot-like metallic layer, wherein the light emitted from the active layer is extracted externally from the substrate side.

8 Claims, 2 Drawing Sheets

(56) References Cited

U.S. PATENT DOCUMENTS

| | | |
|---|---|---|
| 7,335,916 B2 | 2/2008 | Kim et al. |
| 2006/0255342 A1* | 11/2006 | Kim et al. .................. 257/79 |
| 2012/0056153 A1 | 3/2012 | Saito et al. |

FOREIGN PATENT DOCUMENTS

| | | |
|---|---|---|
| JP | 2004-071655 | 3/2004 |
| JP | 2005-72603 | 3/2005 |
| JP | 2005-116794 A | 4/2005 |
| JP | 2005-129907 | 5/2005 |
| JP | 2005-244207 | 9/2005 |
| JP | 2006-24750 A | 1/2006 |
| JP | 2006-135293 | 5/2006 |
| JP | 2007-36078 A | 2/2007 |
| JP | 5197186 B2 | 2/2013 |
| WO | WO 2007/120016 A1 | 10/2007 |

OTHER PUBLICATIONS

Office Action issued Oct. 18, 2011 in Japan Application No. 2008-170967 (With English Translation).

Japanese Office Action mailed Oct. 8, 2013 for JP Patent Application No. 2012-275569 (with English Translation).

Japanese Office Action issued May 7, 2013 in Patent Application No. 2011-209816 with English Translation.

* cited by examiner

SEMICONDUCTOR LIGHT-EMITTING DEVICE

CROSS-REFERENCE TO RELATED APPLICATIONS

This application is a continuation of and claims the benefit of priority under 35 U.S.C. §120 from U.S. Ser. No. 12,238,818, filed Sep. 21, 2011, which is a continuation of U.S. application Ser. No. 12/408,806, now U.S. Pat. No. 8,093,608, filed Mar. 23, 2009, which is based upon and claims the benefit of priority from prior Japanese Patent Application No. 2008-170967, filed Jun. 30, 2008, the entire contents of each of which are incorporated herein by reference.

BACKGROUND OF THE INVENTION

1. Field of the Invention

This invention relates to a semiconductor light-emitting device which can be driven with a low driving voltage and is high in light-extraction efficiency.

2. Description of the Related Art

There has been known a semiconductor light-emitting device which is constructed such that an n-type semiconductor layer, an active layer and a p-type semiconductor layer are successively laminated on a substrate and an ohmic electrode is attached to each of these semiconductor layers. In the case of the conventional light-emitting device which is provided with a reflective electrode for extracting light from the substrate side, Ag, which is high in reflectance, is generally employed as a reflective electrode material. Namely, while the reflectance of Ag is as very high as 96.6%, the reflectance of other metals that have been employed as an electrode likewise is very low, i.e. the reflectance of Au is 38.7%, the reflectance of Cu is 55.2%, and the reflectance of Ni is 41.2%.

However, when the reflective electrode consists of a single layer of Ag, not only the adhesion but also the ohmic property of the reflective electrode becomes poor, thereby making it difficult to manufacture a semiconductor light-emitting device having excellent properties.

In view of improving the adhesion and ohmic properties of this reflective electrode, there has been proposed a semiconductor light-emitting device wherein an Ni layer is interposed between the Ag layer and a nitride semiconductor layer (See for example JP-A 2000-294837).

However, in the case of the semiconductor light-emitting device proposed as described above, there is a problem that the reflectance is caused to decrease due to the interposition of the Ni layer, thereby making it difficult to fully utilize the excellent reflectance which Ag inherently has.

BRIEF SUMMARY OF THE INVENTION

An object of the present invention is to provide a semiconductor light-emitting device which is provided with an electrode structure exhibiting a high ohmic property and a high reflectance, and can be driven with a low driving voltage, enabling the device to exhibit an excellent light-extraction efficiency.

According to a first aspect of the present invention, there is provided a semiconductor light-emitting device comprising a substrate; an n-type semiconductor layer formed on the substrate; an active layer laminated on the n-type semiconductor layer and capable of emitting a light; a p-type semiconductor layer laminated on the active layer; an n-electrode which is disposed on a lower surface of the semiconductor substrate or on the n-type semiconductor layer and spaced away from the active layer and p-type semiconductor layer; and a p-electrode which is disposed on the p-type semiconductor layer and includes a reflective ohmic metal layer formed on the dot-like metallic layer; wherein the light emitted from the active layer is extracted externally from the substrate side.

According to a second aspect of the present invention, there is provided a semiconductor light-emitting device comprising: a sapphire substrate; an n-type clad layer formed of GaN and laminated on the sapphire substrate; a multiple quantum well layer which is formed of InGaN, laminated on the n-type clad layer and capable of emitting a light; a p-type clad layer formed of AlGaN and laminated on the multiple quantum well layer; an n-electrode which is disposed on a lower surface of the sapphire substrate or on the n-type clad layer and spaced away from the multiple quantum well layer and p-type clad layer; and a p-electrode which is disposed on the p-type clad layer and includes a dot-like metallic layer and reflective ohmic metal layer formed on the dot-like metallic layer; wherein the light emitted from the multiple quantum well layer is extracted externally from the substrate side.

According to a third aspect of the present invention, there is provided a method of manufacturing a semiconductor light-emitting device described above, wherein the p-electrode is formed by a process comprising forming the dot-like metallic layer on the p-type semiconductor layer; forming the reflective ohmic metal layer on the dot-like metallic layer; and subjecting the reflective ohmic metal layer to a heat treatment in an atmosphere containing oxygen at a temperature ranging from 350° C. to lower than 600° C.

DETAILED DESCRIPTION OF THE INVENTION

The semiconductor light-emitting device according to one aspect of the present invention comprises a substrate; an n-type semiconductor layer formed on the substrate; an active layer laminated on the n-type semiconductor layer and capable of emitting a light; a p-type semiconductor layer laminated on the active layer; an n-electrode which is disposed on a lower surface of the semiconductor substrate or on the n-type semiconductor layer and spaced away from the active layer and from the p-type semiconductor layer; and a p-electrode which is disposed on the p-type semiconductor layer. In this semiconductor light-emitting device, the light emitted from the active layer is extracted externally from the substrate side, and the p-electrode includes a dot-like metallic layer and reflective ohmic metal layer formed on the dot-like metallic layer.

In this semiconductor light-emitting device constructed as described above, the dot-like metallic layer may be formed of Ni or Pd. Further, the reflective ohmic metal layer may be formed of Ag.

With respect to the film thickness of the dot-like metallic layer, it may be confined to range from 1 nm to 3 nm. Further, the area ratio of the dot-like Ni layer to an entire area of the p-electrode may range from 50% to 85%. Furthermore, a nickel oxide may be interposed between the p-type semiconductor layer and the reflective ohmic metal layer.

As described above, according to one aspect of the present invention, since the p-electrode includes a dot-like metallic layer and reflective ohmic metal layer formed on the dot-like metallic layer, it is possible to provide a semiconductor light-emitting device which is equipped with an electrode structure exhibiting a high ohmic property and high reflectance, and can be driven with a low driving voltage, enabling the light-emitting device to exhibit a high light-extraction efficiency.

Next, various embodiments of the present invention will be explained.

Figure 1:
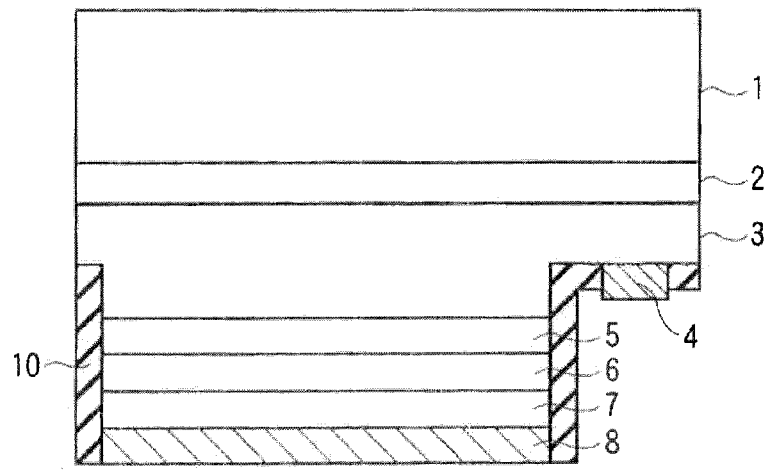
FIG. 1 is a cross-sectional view of a semiconductor light-emitting device according to one embodiment of the present invention.

FIG. 1 is a cross-sectional view of the construction of a blue LED representing the semiconductor light-emitting device according to one embodiment of the present invention. In FIG. 1, a buffer layer 2 formed of GaN, an n-type GaN layer (n-type clad layer) 3, a multiple quantum well layer (active layer) 5 formed of InGaN, a p-type clad layer 6 formed of AlGaN, and a p-type GaN layer 7 are successively laminated by means of epitaxial growth on a substrate such as a sapphire substrate 1. A mesa is created at a portion of the n-type GaN layer 3 for forming an n-electrode 4. A p-electrode 8 is disposed on the p-type GaN layer 7. The surface of the mesa as well as the sidewalls of the n-type GaN layer 3, the multiple quantum well layer 5, the p-type clad layer 6 and the p-type GaN layer 7 are covered with an insulating film 10.

In the semiconductor light-emitting device constructed as described above, the p-electrode 8 is formed of a continuous film which is a dot-like metal layer, and a reflective ohmic metal layer formed on this dot-like metal layer. The dot-like metal layer may be formed of Ni or Pd. The reflective ohmic metal layer may be formed of Ag or Al.

Further, the n-side electrode 4 may be a laminated metal film such as a Ti/Al/Ni/Au film, etc.

The dot-like metal layer is not formed of a continuous film but formed of a film wherein a large number of metallic dots are arranged with gaps being interposed between dots and the underlayer being exposed from the gaps. The area ratio of the dot-like metal layer may preferably be confined to 50%-85%. If the area ratio of the dot-like metal layer is less than 50%, the adhesion thereof tends to become poor. If the area ratio of the dot-like metal layer is larger than 85%, the dot-like metal layer is rendered to become nearly a continuous film, and the reflectance of the electrode tends to decrease.

Incidentally, the dot-like metal layer need not necessarily be configured such that the dots are completely isolated from each other, enabling all of the dots to exist independently. Namely, even if the dots are connected with each other to create a network structure, it is possible to secure excellent adhesion and a reflectance as long as the area ratio thereof is confined to the aforementioned range.

With respect to the film thickness of the dot-like metal layer, it may preferably be confined to the range of 1 nm to 3 nm. If the film thickness thereof is less than 1 nm, not only it may become difficult to create such a thin layer but also the effect of improving the adhesion of the dot-like metal layer may be more likely deteriorated. Further, if the film thickness thereof becomes larger than 3 nm, the dot-like metal layer tends to become a continuous film, thereby more likely deteriorating the reflectance.

When the film thickness of the dot-like metal layer is 1 nm to 3 nm, a size of a dot forming the dot-like metal layer may be about 100 nm or less.

The p-electrode 8 which includes a dot-like metal layer such as an Ni layer and a reflective ohmic metal layer such as an Ag layer can be formed as described below.

First of all, by means of a vacuum vapor deposition method, a dot-like Ni layer is deposited on the surface of the p-type GaN layer 7. This dot-like Ni layer can be created by vacuum vapor-depositing Ni at a film-forming rate of about 1.0-5.0 A/sec. for example, taking a time period of as short as about 2 seconds to 30 seconds. If the film-forming rate is slower than the aforementioned range or the film-forming time is longer than the aforementioned range, it may become difficult to obtain a dot-like Ni layer, thus more likely creating a continuous Ni layer.

Namely, in order to obtain a dot-like Ni layer having the aforementioned area ratio and film thickness, it is only required to optionally control the film-forming rate and film-forming time.

Figure 2A:
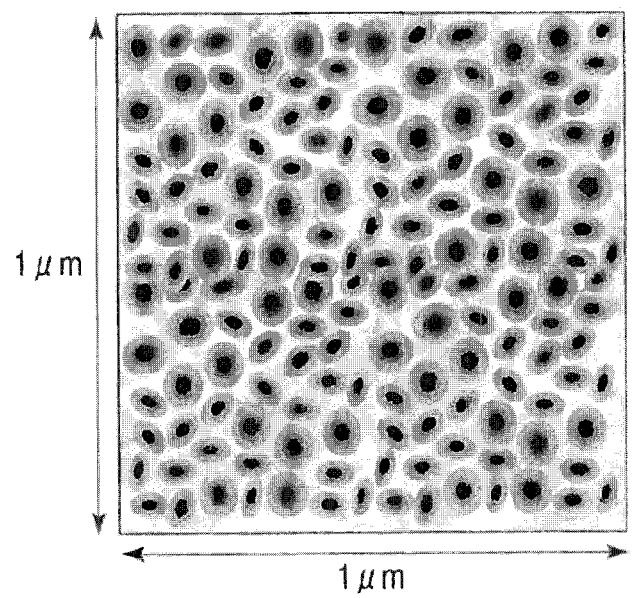
FIGS. 2A and 2B represent plan views showing the surface condition of a dot-like Ni layer and a continuous Ni layer, respectively.
Figure 2B:
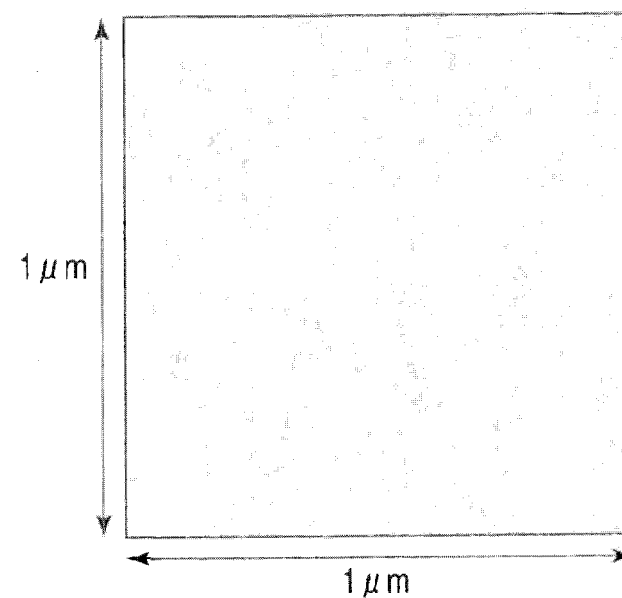

A schematic view illustrating the surface condition of the dot-like Ni layer which was created under the conditions as described above is shown in FIG. 2A. Further, a schematic view illustrating the surface condition of the Ni layer which was formed as a continuous film is shown in FIG. 2B. It will be recognized from the comparison between FIG. 2A and FIG. 2B that the dot-like Ni layer has a surface feature which is quite different from that of the Ni layer formed as a continuous film.

Next, by means of a vacuum vapor deposition method also, Ag is deposited on the dot-like Ni layer to form a continuous Ag film. Thereafter, this dot-like Ni layer/Ag continuous film is subjected to a heat treatment at a temperature of 350° C.-600° C., for example 400° C. in a heat treatment apparatus such as an infrared ray lamp annealing apparatus, thereby enabling part of the dot-like Ni to bond to the residual oxygen left on the surface of the p-type GaN layer 7 or to the oxygen existing in the heat treatment atmosphere, thus converting Ni to NiO.

Since NiO exhibits a high permeability to light of emission wavelength (about 400-500 nm) from a blue light-emitting device, it is possible to further enhance the reflectance of the p-electrode.

Further, since Ni is enabled to diffuse into the Ag or GaN region to form an alloy, it is also possible to obtain an effect of enhancing the adhesion of the electrode.

Preferable conditions for the heat treatment are as follows.
Temperature: 400° C.;
Atmosphere: Oxygen:Nitrogen=8:2;
Treatment time: One minute.

If the heat treatment temperature is too high, the migration of Ag may become higher, thereby causing the generation of non-uniformity of the electrode surface to a magnitude in the order of several micrometers. Further, if the treatment time is too long, similar phenomenon as described above would be generated.

Figure 3:
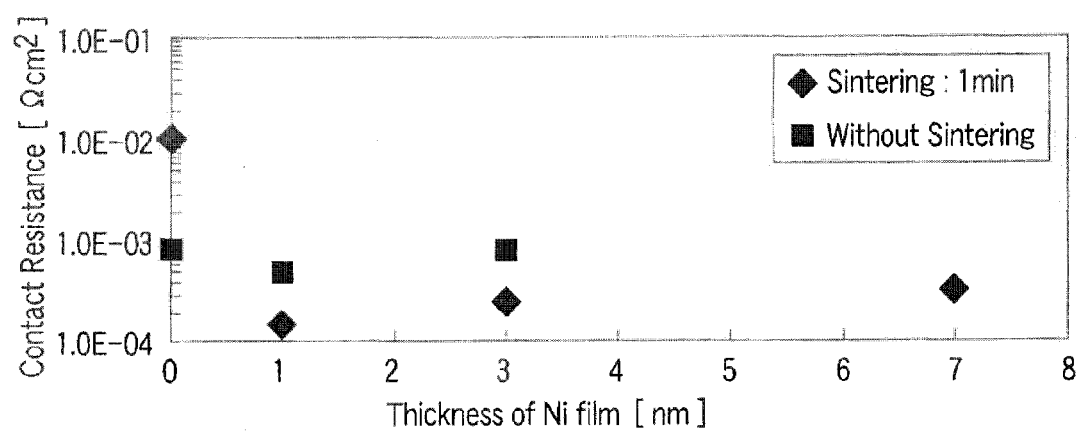
FIG. 3 is a graph showing the changes of contact resistance resulting from the changes in film thickness of the dot-like Ni layer.

When the contact resistance of the Ni/Ag electrode was measured while changing the film thickness of the Ni film, the results shown in FIG. 3 were obtained. It will recognized from FIG. 3 that due to the provision of the Ni film, the contact resistance was caused to decrease and that even in the case of a fairly thin film thickness, the contact resistance thereof was caused to decrease.

Incidentally, it has been recognized that when the film thickness of the Ni film is confined to the range of 1 nm-3 nm, it is possible to obtain excellent results. When the film thickness of the Ni film becomes larger than 3 nm, it may be difficult to obtain a dot-like Ni film and hence the reflectance of the electrode may be deteriorated.

Next, the peeling test for evaluating the adhesion of the Ni/Ag electrode and the test for evaluating the reflectance of the electrode were performed as follows.

Peeling Test:

The peeling test was performed as follows. Namely, a dot-like Ni film having a film thickness ranging from 1 nm-3 nm was deposited on a substrate and then an Ag layer having a thickness of 200 nm was deposited on the dot-like Ni film to create a sample of the Ni/Ag electrode. Then, by making use of a scriber, etc., scratching was performed to divide only the Ni/Ag electrode, thereby creating 100 regions of Ni/Ag electrode (each 1 mm square). Thereafter, an adhesive cellophane tape was adhered to the divided Ni/Ag electrode portions and then the adhesive cellophane tape was peeled off, thus counting the number of these divided Ni/Ag electrode portions which were peeled away out of 100 Ni/Ag electrode portions.

As a result, none of these divided Ni/Ag electrode portions were peeled away.

For the purpose of comparison, a sample comprising only a single layer of Ag having a thickness of 200 nm without accompanying the dot-like Ni film was created and then tested in the same manner as described above, finding that all of 100 Ag electrode portions were peeled away. Further, a sample of the Ni/Ag electrode having a continuous Ni film (3 nm in film thickness) substituting for the dot-like Ni film was created and then tested in the same manner as described above, finding that only three regions of the 100 divided regions were peeled away. Accordingly, it will be recognized that even if a continuous Ni film is formed in place of the dot-like Ni film, some degree of improvement in adhesion can be realized. Incidentally, the fact that the employment of the dot-like Ni film was far superior in improving the adhesion of the electrode as compared with the continuous Ni film may be assumably attributed to the increased contact area between the rugged surface of the dot-like Ni film and the Ag surface as compared with the sample where the continuous Ni film was employed.

Test for Evaluating the Reflectance:

The same sample as employed in the peel test was employed and the reflectance of the surface thereof was measured. In this measurement, a light was irradiated from a halogen lamp light source to a circular region having a diameter of 5 mm and the intensity of reflection from the sample was measured. Further, the reflectance was determined based on the intensity of the reflection which was obtained as a single layer of Ag was formed by means of vapor deposition, this intensity of reflection being defined as 100.

As a result, the reflectance of the sample of Ni/Ag electrode was 94.4%.

When the reflectance of a sample of the Ni/Ag electrode having a continuous Ni film (3 nm in film thickness) substituting for the dot-like Ni film was measured, the reflectance thereof was as low as 74.6%.

It will be recognized from the results obtained from the above peeling test and reflectance measurement that in the case of the sample which was constructed to have only the single layer of Ag, although the reflectance thereof was high, the adhesion thereof was very poor, and that in the case of the sample of the Ni/Ag electrode wherein a continuous Ni film was employed, although an improvement in adhesion was recognized, the reflectance thereof was too poor to enable it to exhibit a function as a reflective electrode.

The reason for this problem may be attributed to the fact that when a continuous Ni film was formed, the Ni film was permitted to interpose throughout the entire interface between the p-type GaN surface and the Ag layer, thereby making it impossible to enable the high reflectance Ag layer to sufficiently exhibit the function thereof. Whereas, in the case of the Ni/Ag electrode wherein a dot-like Ni film was employed, since the Ag layer was enabled to directly contact the p-type clad layer without the interposition of the Ni layer, the high reflectance Ag layer was enabled to sufficiently exhibit the function thereof.

Although the foregoing explanation has been made based mainly on the cases wherein an Ni layer was employed as a dot-like metal film, it should not be construed that the present invention is limited to the Ni layer. Namely, even if a dot-like Pd layer is employed in place of the Ni layer, it is possible to obtain almost the same effects as described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor light-emitting device comprising:
    an n-type semiconductor layer comprising at least n-type GaN layer;
    a p-type semiconductor layer comprising at least p-type GaN layer;
    an active layer interposed between the n-type semiconductor layer and the p-type semiconductor layer and capable of emitting a light;
    an n-electrode which is contact with the n-type GaN layer and spaced away from the active layer and p-type semiconductor layer; and
    a p-electrode which is contact with the p-type GaN layer and includes a dot-like nickel oxide region in direct contact with the p-type GaN layer and a Ag layer formed on the dot-like nickel oxide region,
    wherein the dot-like nickel oxide region is interposed between the p-type GaN layer and the Ag layer.

2. The device according to claim 1, wherein the dot-like nickel oxide region has a film thickness ranging from 1 to 3 nm.

3. The device according to claim 1, wherein the dot-like nickel oxide region is formed to have an area ratio ranging from 50% to 85% based on an entire area of the p-electrode.

4. A method of manufacturing a semiconductor light-emitting device according to claim 1, wherein the p-electrode is formed by a process comprising:
    forming the dot-like nickel region on the p-type semiconductor layer;
    forming the Ag layer on the dot-like nickel region; and
    subjecting the Ag layer to a heat treatment in an atmosphere containing oxygen at a temperature ranging from 350° C. to lower than 600° C.

5. The method according to claim 4, wherein the dot-like nickel oxide region has a film thickness ranging from 1 nm to 3 nm.

6. The method according to claim 4, wherein the dot-like nickel oxide region is formed to have an area ratio ranging from 50% to 85% based on an entire area of the p-electrode.

7. The device according to claim 1, wherein the Ag layer is formed as a reflective electrode.

8. The device according to claim 1, wherein Ni diffuses into the Ag layer to form an alloy.

* * * * *